ID [19]

United States Patent
Howe

[11] 4,002,504
[45] Jan. 11, 1977

[54] MULTIFILAMENT SUPERCONDUCTORS

[75] Inventor: David G. Howe, Greenbelt, Md.

[73] Assignee: The United States of America as represented by the Secretary of the Navy, Washington, D.C.

[22] Filed: Dec. 23, 1975

[21] Appl. No.: 643,899

[52] U.S. Cl. .......................... 148/11.5 R; 29/191.6; 29/599; 148/34
[51] Int. Cl.² .......................................... H01L 39/00
[58] Field of Search ................. 148/11.5 F, 11.5 R, 148/34, 127; 29/599, 191.6

[56] References Cited
UNITED STATES PATENTS

| | | | |
|---|---|---|---|
| 3,910,802 | 10/1975 | Wong | 148/32 |
| 3,926,684 | 12/1975 | Howe | 148/34 X |

*Primary Examiner*—Arthur J. Steiner
*Attorney, Agent, or Firm*—R. S. Sciascia; Philip Schneider; Thomas McDonnell

[57] ABSTRACT

A multifilament composite superconductor which comprises (1) a matrix sheath selected from the group consisting of a copper-gallium (Cu—Ga) alloy with a gallium content from 0.4 to 22 at.%, a copper-tin (Cu—Sn) alloy with a tin content from 1 to 11 at. %, and a copper-silicon (Cu—Si) alloy with a silicon content from 0.5 to 14 at. %; (2) multiple filaments embedded in said encasing matrix sheath and selected from the class consisting of a vanadium-gallium (V—Ga) alloy with a gallium content from 0.4 at. % to 12.5 at. %, a niobium-tin (Nb—Sn) alloy with a tin content from 0.1 at. % to 12.0 at. %, and vanadium-silicon (V—Si) alloy with a silicon content from 0.5 to 10 at. %; and (3) a continuous interfacial layer between said matrix and each filament of an A-15 compound selected from the class consisting of $V_3Ga$, $Nb_3Sn$, and $V_3Si$. A method for producing said multifilament composite superconductors by mechanical deformation of a multifilament coaxial cylinder consisting of filaments and matrix sheath which comprises a homogenization anneal of the filaments and the matrix rod before assembly thereof, a series of reductions followed by anneals, and a solid stage reaction between the filaments and matrix in vacuum or an inert atmosphere and at a temperature from about 475° to 700° C for the production of $V_3Ga$ and $V_3Si$ and at a temperature from about 525° to about 850° C for the production of $Nb_3Sn$.

8 Claims, 4 Drawing Figures

MULTIFILAMENT SUPERCONDUCTORS

BACKGROUND OF THE INVENTION

This invention relates generally to superconductors and in particular to superconductors made from a solid state reaction between two alloys.

Superconductors are usually compared in terms of critical current, $I_c$, critical current densities, $J_c$, and the critical temperature, $T_c$. Critical current density values indicate the ability of the material to carry large currents. Values are obtained by dividing the critical current by the cross sectional area of the superconductor. The critical current $I_c$, is defined as the maximum current passed through a conductor in a transverse magnetic field before a measurable voltage appears in the conductor. The critical temperature, $T_c$, is the temperature at which a material achieves the superconducting property. Since the transition from "normal" to superconduction occurs over a temperature range, values for this parameter have been variously reported at the onstart of superconduction or at the midpoint of the temperature range. For the purposes of this application the critical temperature is the midpoint of the range and hence would be lower than the values reported in the other manner.

Intermetallic compounds having an A-15 crystal structure are known to be exceptional superconducting materials. This structure is also referred to as a beta-tungsten crystalline structure. One of the ways in which these compounds are obtained is by a solid state reaction between two alloys in a vacuum or inert atmosphere at an elevated temperature. These compounds are then used in a composite structure with the two reactant alloys. Three excellent examples of such superconductors are composites of VGa—$V_3$Ga—CuGa, NbSn—$Nb_3$Sn—CuSn, and VSi—$V_3$Si—CuSi.

The major difficulty associated with manufacturing superconductors with A-15 compounds is fabricating them into usable configurations. First of all the A-15 compounds are extremely brittle and some of the reactant alloys also become brittle through work hardening. Another problem is the adverse effect impurities may have on the completed composite superconductor. Tightness of the bond between the two alloys producing the A-15 compound and grain size of the resulting A-15 compound are also important considerations.

These difficulties become particularly severe with the construction of multifilament wires. Since the construction of a multifilament wire begins with a multiple cavity matrix rod, the required cavity outgassing prior to the insertion of the filaments becomes especially difficult. If any cavity is not completely vacuated, growth of the A-15 compound is disrupted by diffusion barriers created by the remaining gases. The filament alloys have different hardness levels and different work hardening rates than the matrix alloys. Such differences can cause the filaments to cut through the matrix; so that, processing results in either the filaments extending through the surface of the matrix or touching each other. Another source of difficulty in processing multiple filament wires is the greatly reduced size of the filaments before and after processing. At best the size of the multiple filament is 1/10 that of the single filament and often is 1/100 of the single filament.

Processing superconducting single filament wires made from composites of VGa—$V_3$Ga—CuGa, or NbSn—$Nb_3$Sn—CuSn, or VSi—$V_3$Si—CuSi has been disclosed in U.S. Pat. No. 3,811,185 of Howe et al. issued on May 21, 1974 and entitled Method for Enhancing $V_3$Ga Thin Film Growth and in U.S. Pat. No. 3,926,684 issued on Dec. 16, 1975 of David G. Howe. Multifilament superconducting wires have been fabricated for numerous composite e.g., V—$V_3$Ga—Cu—Ga or Nb—$Nb_3$Sn—CuSn. However the aforementioned composites have not been fabricated into multifilament wire by these methods or by any other methods.

SUMMARY OF THE INVENTION

It is therefore an object of this invention is to provide a multifilament composite superconductor comprised of VGa—$V_3$Ga—CuGa or NbSn—$Nb_3$Sn—CuSn, or VSi—$V_3$Si—CuSi and a method of preparation thereof.

It is also an object of this invention to provide multifilament superconductors made from near or actual two phase alloys.

Another object is to provide multifilament superconductors with a critical temperature above 14.5° K.

A further object of this invention is to provide a multifilament superconductor with a critical current density greater than $1.0 \times 10^6$ amps/cm² at 4.2° K and in a transverse magnetic field of 100kG.

These and other objects are achieved through the fabrication of multifilament superconductors by a process similar to the process disclosed in U.S. patent application Ser. No. 527,000 filed on Nov. 25, 1974 by David G. Howe but differing in the construction of the composite assembly, the final anneal temperature range, and the solid state reaction temperatures.

DETAILED DESCRIPTION OF THE INVENTION

The composition of the alloys from which the composite multifilament superconductors of the present invention is given in Table I:

Table I

| Alloy | at. % of solute metal | |
|---|---|---|
| | range | preferred |
| Cu-Ga | 0.4–22 | 15–18 |
| Cu-Sn | 1–11 | 7–9 |
| Cu-Si | 0.5–14 | 7–11 |
| V-Ga | 0.4–12.5 | 4–8 |
| Nb-Sn | 0.1–12 | 0.5–5 |
| V-Si | 0.5–10 | 4–6 |

Figure 1:
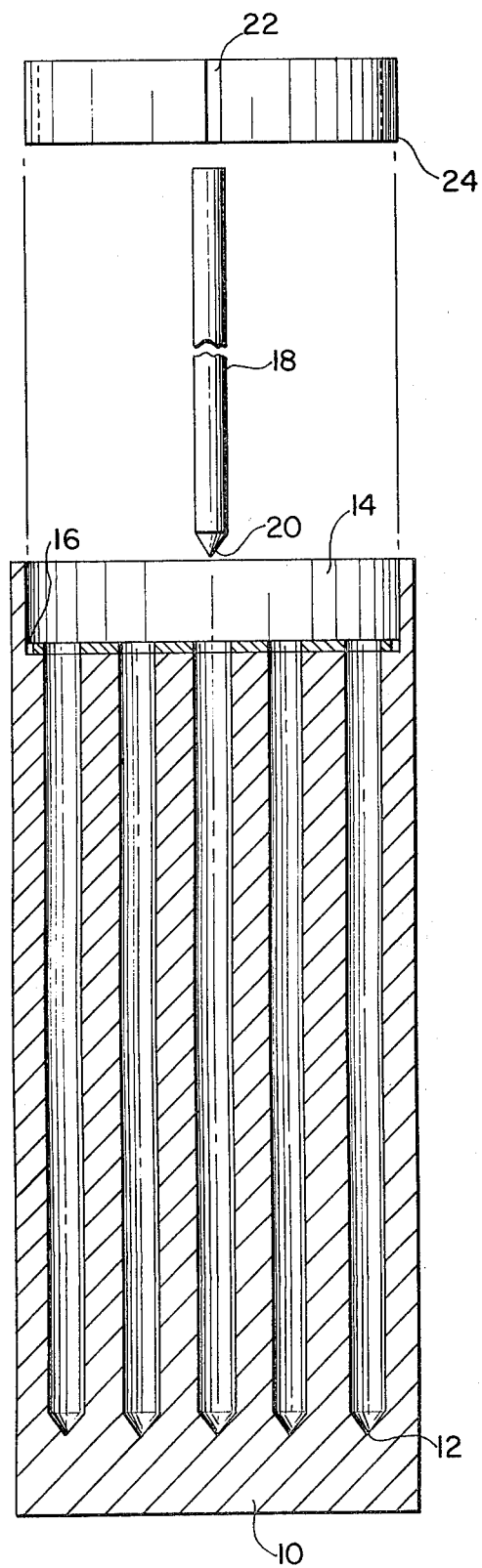
FIG. 1 is a cross sectional view of an unassembled multifilament matrix, a single filament, and an end plug utilized in the fabrication of superconductors of this invention.

FIG. 1 shows, prior to assembly, the components of the composite assembly which is machined and reacted to form the composite multifilament superconductors of the present invention. Essentially the composite assembly comprises a matrix rod 10, filament rods 18, and end plug 22. The matrix rod has multiple cavities 12 which may or may not be tapered and a recess 14 at the open end of the matrix rod 10. The cavities may be in any configuration and number, but preferably the cavities are arranged in concentric circles. If the work piece is not assembled in a vacuum, a small ridge 16 must be located at the bottom of recess 14 so that end plug 22 does not rest on the assembled filaments or the bottom of recess 14. This air space allows each cavity to be completely evacuated after assembly; so, an air space depth of 0.005 inches (0.013 cm) is sufficient.

The filaments 18 should be slightly shorter than the length of the cavity in which they are placed. Since the purpose of the difference in lengths is to ensure an easy and complete evacuation of the cavity, the difference need only be 0.005 inches (0.013 cm). The end of a filament is preferably notched and/or tapered.

End plug 22 may be copper or copper-gallium alloy for any of the composites of this invention. It is preferred that the end plug extends about a quarter of an inch (0.064 cm) beyond the matrix rod, thereby allowing the composite assembly to be sealed by, e.g. melting the excess through electron beam welding. In order to improve outgassing end plug 22 has a plurality of channels 24 on its circumference. The size of the channels is such that all the bores of the matrix rod can be completely evacuated after the composite assembled. Of course if the composite assembly is assembled in a vacuum, the channels in the end plug would not be necessary.

Figure 2:
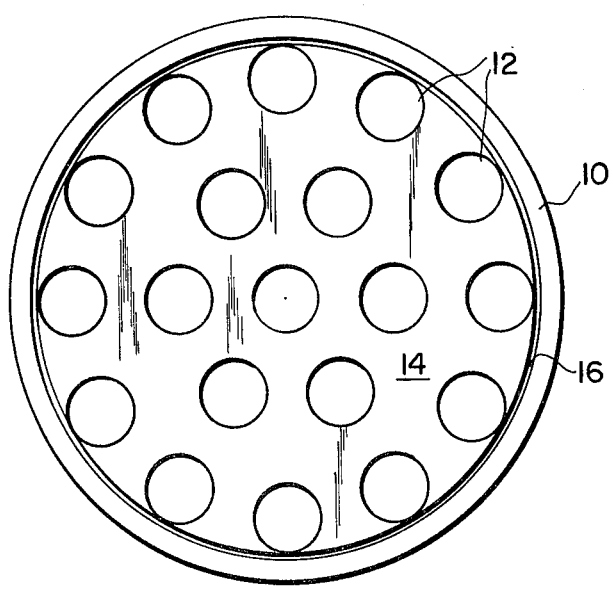
FIG. 2 is a top view of a multifilament matrix sheath of the invention.
Figure 3:
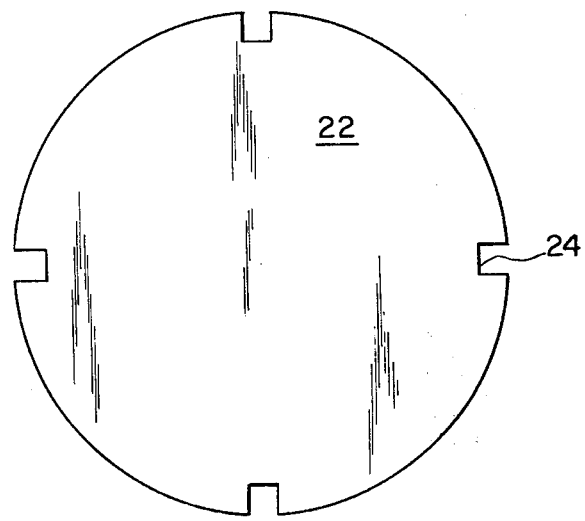
FIG. 3 is a view of an end plug of this invention.

In FIG. 2 a top view of matrix rod 10 shows cavities 12, recess 14, and ridge 16. The arrangement of cavities shown is the preferred arrangement and of course, fewer cavities could be used as well as additional cavities. The top view of end plug 22 in FIG. 3 shown an end plug with four channels 24.

The initial size of the filament rods, matrix rod, and end plug may be any size and would depend on the length of the final wire. In order to manufacture a long length of wire, the initial thickness of the starting components must be correspondingly large.

The preassembly processing of the assembly components is similar to the process disclosed in the previously cited patent application by David G. Howe which is herein incorporated by reference. The steps of the preassembly processing of this invention is now given.

Prior to assembly the matrix rods are surface cleaned by machining and are given an homogenization anneal. The annealing time is from 16 to 24 hours depending on the degree of initial homogeneity and the degree of final homogeneity desired. The homogenization temperature is from 700° to 800° C for copper-gallium, from 750° to 850° C for copper-silicon, and from 600° to 700° C for copper-tin. It is preferred that the lower half of anneal temperature range is used for alloys in the upper 10% of the alloy range. Again shorter times for the anneal may be used than the following ones if the alloys have a greater initial homogeneity. The duration of the homogenization anneal depends on how thoroughly the alloy was blended during manufacturing prior to the final melting and casting of the rods. For the vanadium-gallium and vanadium-silicon filament rods, an anneal at a temperature from about 800° to about 1200° C for about 16 to about 80 hours is used. An anneal temperature from 1050° to 1150° C and an anneal time from 24 to 64 hours are preferred. A homogenization anneal for about 16 to about 80 hours and at a temperature from about 1100° to 1400° C is to be used for niobium-tin filament rods. The preferred ranges are 24 to 64 hours and 1200° to 1300° C. Longer anneal times may be used for the filament rods and matrix rods, but the improvement in the product would not equal the additional costs. Like the previous process there is much latitude with the length of time for all of the anneals of this process. The critical aspects of the numerous anneals of this process are the timing and sequence of their occurrence and the temperatures used. Also all the anneals of this process are conducted in an inert atmosphere or vacuum.

The filament rods, after the homogenization anneal, and the matrix rod are reduced in diameter by swaging, rolling, or similar techniques. After each reduction of 20% in diameter the rods are annealed. The matrix rod is annealed at a temperature from 500° to 525° C and the filament rods are annealed at a temperature from 800° to 900° C with the exception of the niobium-tin alloy which is annealed at a temperature 300° C greater than the other filament rods. These reductions and anneals are repeated until the desired diameter is reached. The purpose of starting with a larger size and mechanically reducing to a smaller size rather than starting the smaller size initially is to break up the grains in the alloys.

The matrix rod is bored out to form the multicavity matrix. The cavities are from about 0.004 (0.01 cm) to about 0.006 (0.015 cm) inches greater in diameter than the filament which are to be inserted. Before the filaments are inserted into the matrix which forms the composite assembly the filaments are subjected to another anneal at a temperature from about 750° to about 850° with 800° C preferred for a period from about 2 to about 16 hours. The one exception to the above is the niobium alloy. For that alloy the annealing temperatures should be increased 300° C. The matrix rod is also annealed. For all three alloys the annealing temperature is from about 500° to about 800° C and the annealing time is at least about 1 hour.

The composite assembly is formed and is then completely evacuated by a vacuum pump. Great care must be taken to ensure the complete evacuation by all cavities in the matrix rod before sealing by electron beam welding. The processing steps of multifilament composite wires of the invention after assembly are similar to steps of the incorporated reference. The processing of the invention proceeds as follows.

The composite assembly is reduced in diameter by swaging, rolling or similar technique. After the diameter has been reduced by 20%, the composite is heated at a temperature from about 500° to 525° C for at least 1 hour. The composite is again reduced by 20% and another anneal like the previous one is applied to the composite. After the next reduction of 20%, the composite is heated at temperatures from 550° to about 575° C for at least 1 hour. This temperature range differs from the incorporated reference by 25° C. This series of 20% reductions followed by an anneal is repeated until the composite reaches a diameter from about 0.080 (0.203 cm) to about 0.090 (0.229 cm) inches. The composite is then reduced in diameter by wire drawing using the same relationship of 20% reductions and intermediate anneals.

As a practical matter the anneal time can be reduced as the diameter of the composite is reduced, so that, at a diameter of about 0.050 inches (0.127 cm) the anneal time can be as low as 40 minutes. This particular sequence of anneals at the specified temperatures and times are necessary to keep the composite ductile enough to permit further reductions in the cross sectional size of the composite.

After the composite is reduced to the desired diameter, the composite is heated so that the intermetallic layer is formed by the resulting solid state reaction. Except for the Nb—Sn, Cu—Sn composite, the reaction temperature may be from about 475° to about 700° C, but preferably is from 500° to 625° C. The most preferred range is from 500° to 575° C. The reaction temperature ranges for the Nb—Sn, Cu—Sn composite is from about 525° to about 850° C with 550° to 800° C preferred and with 550° to 775° C most preferred.

It has been determined that the higher temperatures cause the grains of intermetallic compound to be "grown" too large. Smaller grains are desirable because grain boundaries are known to be flux pinning sites in these A-15 intermetallic compounds and with the finer grain sizes more pinning sites are available thereby enabling higher critical current densities to be obtained.

The solid state reaction rate and thus the reaction time depend on the reaction temperature, the components of the alloy, and their respective concentrations. Hence the practice of this invention would require a person to prepare thickness growth graphs for each particular alloy at the selected reaction temperature. The thickness of the layer may be grown as thick as 30.0 microns, but it is preferred that the thickness is from 0.4 to 3 microns with 0.4 to 1.5 microns most preferred.

The general nature of the invention having been set forth, the following example is presented as a specific illustration of the practice thereof. It is understood that the invention is not limited to the example but is susceptible to different modifications that would be recognized by one of ordinary skill in the art.

EXAMPLE I

Preparation of a 0.032 inch (0.0813 cm) nineteen filament composite wire with a core composition of V-6.1 at. % Ga and with a matrix composition of Cu-17.5 at % Ga.

Rods of V-6.1 at. % Ga alloy and Cu-17.5 at. % Ga were prepared from high purity metals (99.999% Cu, 99.9% V, and 99.99% Ga). The V—Ga alloy was arc melted and cast as ½ inch diameter rods. After a homogenization anneal in an evacuated silica ampoule at a temperature of 1100° C for about 60 hours, the V—Ga rods were removed from the oven and allowed to cool in the silica ampoule to room temperature. The cooling lasted about 1½ hours.

The V-Ga rods were swaged at room temperature to .106 inch (0.269 cm) diameter. Intermediate anneals (800° C - 1 hr) were given after each approximately 50% reduction in diameter. The 0.106 inch (0.269 cm) diameter rod was given a final anneal at 800° C for 16 hours. The Cu—Ga alloy was induction melted, cast as a 1¼ inch (3.175 cm) diameter rod, surface cleaned by machining to 1⅛ inch (2.858 cm) diameter, and swaged to 0.945 inch (2.240 cm) diameter and reannealed. Holes to accept the 19 rods were machined to within ⅜ inch (0.953 cm) of the end of the Cu—Ga rod, and the resulting sheath was then cleaned and annealed at 700° C for 16 hours. Following a final cleaning by chemical etching, V—Ga alloy rods were inserted into the Cu—Ga matrix which in turn was capped with a channeled CuGa end plug. The composite assembly was evacuated to a pressure of $1 \times 10^{-5}$ torr and sealed with an electron beam weld. The sample was then reduced in diameter by the aforedescribed series of swages, wire drawing, and anneals.

Figure 4:
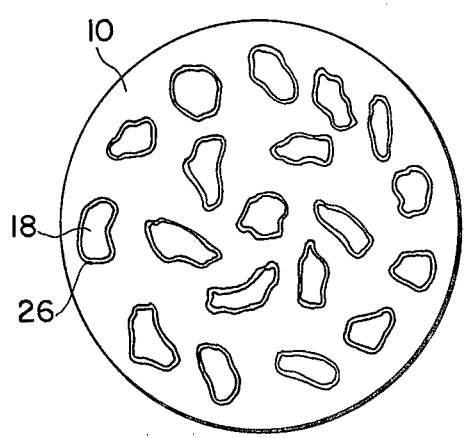
FIG. 4 is a cross sectional view of a superconductor of this invention.

The 0.032 inch (0.0813 cm) diameter composite wire was heated at 556° C for 122 hours. The resulting multifilament wire is illustrated in FIG. 4. Filaments 18 have reacted with matrix 10 to produce the intermetallic superconducting layer 26.

The reacted wire with an average $V_3Ga$ layer thickness of 0.77 microns was tested at 4.2K and a $J_c$ valve of $1.06 \times 10^6$ A/cm$^2$ in a transverse magnetic field of 100 Kilogauss was obtained. These results indicate that the total current in the 19 filament wire would be much greater than the total current in the comparable single filament wires of U.S. Pat. No. 3,811,185 and U.S. patent application Ser. No. 527,000.

The data in Table II further demonstrate the advantages of the multifilament wire over the single filament wire.

Obviously many modifications and variations of the present invention are possible in light of the above teachings. It is therefore to be understood that, within the scope of the appended claims, the invention may be practiced otherwise than as specifically described.

TABLE II

Properties of $V_3Ga$ Composite Wires at 4.2° K

| Wire Configuration Single Filament = 1F Multifilament 19F | Reaction Conditions Temp. (° C.) | Time (Hrs.) | Alloy Composition (at % Ga) V Filament | Cu Matrix | $V_3Ga$ Layer Thickness (Microns) | (Amps) 100 kG | 140 kG | $J_c$ ($10^5$ Amps/cm$^2$) 100 kG |
|---|---|---|---|---|---|---|---|---|
| 1F | 600 | 500 | 0 | 15.4 | 2.3 | 2.7 | 2.1 | 0.7 |
| 1F | 600 | 400 | 6.1 | 15.4 | 2.5 | 5.1 | 4.2 | 1.5 |
| 1F | 600 | 64 | 9.0 | 17.5 | 2.3 | 17.7 | 11.2 | 5.7 |
| 19F | 600 | 244 | 6.1 | 17.5 | 2.5 | 87.6 | 50.7 | 5.3 |
| 19F | 556 | 122 | 6.1 | 17.5 | 0.8 | 54.0 | 30.6 | 10.6 |
| 19F | 556 | 262 | 6.1 | 17.5 | 1.1 | 65.3 | 38.7 | 7.8 |
| 19F | 556 | 400 | 6.1 | 17.5 | 1.4 | 62.4 | 41.7 | 6.3 |
| 1F | 550 | 400 | 9.0 | 17.5 | 1.6 | 21.6 | 5.0 | 10.1 |

Note:
All the above specimens are 0.032 inch diameter wire.

What is claimed and desired to be secured by Letters Patent of the United States is:

1. A composite superconductor which comprises: multifilaments of an alloy selected from the group consisting of a vanadium-gallium alloy with a gallium content from 0.4 at. % to 12.5 at. %, a niobium-tin alloy with a tin content from 0.1 to 12 at. % and a vanadium-silicon alloy with a silicon content of 0.5–10 at. %;

a matrix sheath of an alloy selected from the group consisting of a copper-gallium alloy with a gallium content from about 0.4 to about 22 at. %, a copper-tin alloy with a tin content from about 1 to about 11 at. %, a copper-silicon alloy with a silicon content from about 0.5 to 14 at. %, so that the matrix alloy has the same metal solute as the core alloy; and an intermediate layer of an A-15 compound produced by a solid state reaction between said core rod and said matrix sheath.

2. The composite superconductor of claim 1, wherein;

said filament alloy is are selected from the group consisting of a vanadium-gallium alloy with a gallium content from 4 at. % to 8.0 at. %, a niobium-tin alloy with a tin content from 0.5 to 5 at %, and vanadium-silicon alloy with a silicon content from 0.4 to 6 at. %, and said matrix sheath alloy is selected from the group consisting of copper-gallium alloy with a gallium content from 1.5 to 18.0 at. %, a copper-tin alloy with a tin content from 7 to 9 at. %, and a copper-silicon alloy with a silicon content from 7 to 11 at. %.

3. The composite superconductor of claim 1, wherein;

said filament alloy is a vanadium-gallium alloy with a gallium content from 4 at. % to 8 at. %, and said matrix sheath alloy is a copper-gallium alloy with a gallium content from 15 to 18 at. %.

4. The composite superconductor of claim 3, wherein the thickness of said intermetallic layer is from 0.4 to 3 microns.

5. The composite superconductor of claim 3, wherein the thickness of said intermetallic layer is from 0.4 to 1.5 microns.

6. A method for fabricating a composite superconductor which comprises:

homogenization-annealing filament rods of an alloy selected from the class consisting of a vanadium-gallium (V—Ga) alloy with a gallium content from 0.4 at. % to 12.5 at. %, a niobium-tin (Nb—Sn) alloy with a tin content from 0.1 at. % to 12.0 at. %, and a vanadium-silicon (V—Si) alloy with a silicon content from 0.5 at. % to 10 at. % and a matrix sheath rod of an alloy selected from the class consisting of a copper-gallium (Cu—Ga) alloy with a gallium content from 0.4 at. % to 22 at. %, a copper-tin (Cu-Sn) alloy with a tin content from 1 at. % to 11 at. % and a copper-silicon (Cu-Si) alloy with a silicon content from 0.5 at. % to 14 at. %, reducing said rods by mechanical technique, boring said matrix rod to form a multicavity matrix sheath, forming an end plug having axial grooves about its periphery, annealing said filament rods from about 2 to about 16 hours at a temperature from about 750° C to about 850° C if V—Ga or V—Si is selected, and at a temperature from about 1050° C to about 1150° C if Nb—Sn is selected, annealing said matrix sheath at a temperature from about 500° to about 800° C for at least about 1 hour, etching said filament rods with an etching solution, placing said filament rods within said matrix sheath whereby a binary multicavity composite of an alloy combination selected from the class consisting of (V—Ga)-(Cu—Ga), (V—Si)-(Cu—Si), and (Nb—Sn)-(Cu—Sn) is formed having an annular air space between said matrix sheath and said filament rods, placing said end plug into said matrix sheath, subjecting said composite to a vacuum, sealing said composite while under a vacuum, reducing the diameter of said composite by 20%, annealing said composite at a temperature from about 500° to about 525° C for at least 1 hour, reducing the diameter of said composite by 20%, annealing said composite at a temperature from about 500° to about 525° C for at least one hour, reducing the diameter of said composite by 20%, annealing said composite at a temperature from about 550° to about 575° C for at least 1 hour, repeating the previous reduction steps until the desired diameter of the composite is obtained, and heating said composite at about 475° to about 700° C if said composite is V—Ga, Cu—Ga or V—Si, Cu—Si, whereas if said composite is Nb—Sn, Cu—Sn, the temperature is to be about 525° to about 850° C.

7. The method of claim 6, wherein said composite is heated, to produce said intermetallic layer, at a temperature form 500° to 625° C if said composite is V—Ga, Cu—Ga or V—Si, Cu—Si, and at a temperature from 550° to 800° C if said composite is Nb—Sn, Cu—Sn.

8. The method of claim 6, wherein said composite is heated, to produce said intermetallic layer, at a temperature from 500° to 575° C if said composite is V—Ga, Cu—Ga or V—Si, Cu—Si, and at a temperature from 550° to 775° C if said composite is Nb—Sn, Cu—Sn.

* * * * *